United States Patent [19]

Imai

[11] Patent Number: 5,569,611

[45] Date of Patent: Oct. 29, 1996

[54] METHOD OF MANUFACTURING A BIPOLAR TRANSISTOR OPERATING AT LOW TEMPERATURE

[75] Inventor: Kiyotaka Imai, Tokyo, Japan

[73] Assignee: NEC Corporation, Tokyo, Japan

[21] Appl. No.: 330,361

[22] Filed: Oct. 12, 1994

[30] Foreign Application Priority Data

Dec. 27, 1993 [JP] Japan .................................. 5-332154

[51] Int. Cl.⁶ ................................................ H01L 21/265
[52] U.S. Cl. ............................ 437/31; 437/28; 437/162;
 148/DIG. 10; 148/DIG. 11; 148/DIG. 124;
 148/DIG. 35; 148/DIG. 36
[58] Field of Search .............................. 437/31, 28, 162;
 148/DIG. 10, DIG. 11, DIG. 124, DIG. 35,
 DIG. 36; 257/592, 593

[56] References Cited

U.S. PATENT DOCUMENTS

| | | | |
|---|---|---|---|
| 4,729,965 | 3/1988 | Tamaki et al. | 437/31 |
| 5,106,767 | 4/1992 | Comfort et al. | 148/DIG. 124 |
| 5,217,909 | 6/1993 | Bertagnolli | 437/31 |
| 5,279,976 | 1/1994 | Hayden et al. | 437/162 |
| 5,296,391 | 3/1994 | Sato et al. | 437/31 |
| 5,302,535 | 4/1994 | Imai et al. | 148/DIG. 11 |
| 5,321,301 | 6/1994 | Sato et al. | 257/592 |
| 5,323,057 | 6/1994 | Cook et al. | 257/593 |
| 5,424,228 | 6/1995 | Imai | 437/31 |
| 5,432,104 | 7/1995 | Sato | 148/DIG. 10 |

FOREIGN PATENT DOCUMENTS

| | | | |
|---|---|---|---|
| 63-107167 | 5/1988 | Japan . | |
| 1253272 | 10/1989 | Japan | 257/593 |
| 3224238 | 10/1991 | Japan . | |
| 4-99328 | 3/1992 | Japan . | |
| 4-315438 | 11/1992 | Japan . | |
| 5-129315 | 5/1993 | Japan . | |

OTHER PUBLICATIONS

J. F. Ziegler "Experimental Evaluation of . . . Transistor Pedestal Collector", IBM J. Res. Develop., Nov. 1971, pp. 452–456.
"Base–Emitter Injection Characterization in Low–Temperature Pseudo–Heterojunction Bipolar Transistors", *IEEE Transactions on Electron Devices*, vol. 37, No. 10, Oct. 1990, by Kazuo Yano et al., pp. 2222–2229.
"Reduction of $f_t$ by Nonuniform Base Bandgap Narrowing", *IEEE Electron Device Letters*, vol. 10, No. 8, Aug. 1989, by Simon Szeto et al., pp. 341–343.
"Profile Scaling Constraints for Ion–Implated and Epitaxial Bipolar Technology Designed for 77K Operation", 1991, *IEEE*, by John D. Cressler et al., pp. 861–864.
"Low Temperature Operation of Si and SiGe Bipolar Transistors", 1990 *IEEE*, by E. F. Crabbe et al., pp. 17–20.
"Measurment of Electron Lifetime, Electron Mobility and Band–Gap Narrowing in Heavily Doped p–Type Silicon", 1986 *IEEE*, by S. E. Swirhun et al., pp. 24–27.
"Measurment of Steady–State Minority–Carrier Transport Parameters in Heavily Doped n–Type Silicon", 1987 *IEEE*, by Jesus A. Del Alamo et al., pp. 1580–1589.
"Base Profile Design for High–Performance Operation of Bipolar Transistors at Liquid–Nitrogen Temperature", 1989 *IEEE*, by Johannes M. C. Stork et al., pp. 1503–1509.
"Ultra High Speed Bipolar Device", by T. Sugano, published by Baihuukan, pp. 36–39.

*Primary Examiner*—George Fourson
*Assistant Examiner*—Long Pham
*Attorney, Agent, or Firm*—Young & Thompson

[57] ABSTRACT

In a method of manufacturing a bipolar transistor, an oxide film pattern is formed on an epitaxial collector layer of a first conductive type which is formed on a buried layer of the first conductive type. A selectively-ion-implanted-collector (SIC) region is then formed in the collector layer, and after that, a base layer is grown on the SIC region with an inversely graded impurity distribution profile.

9 Claims, 13 Drawing Sheets

METHOD OF MANUFACTURING A BIPOLAR TRANSISTOR OPERATING AT LOW TEMPERATURE

BACKGROUND OF THE INVENTION

1. Field of the Invention

The present invention relates to a method of manufacturing a semiconductor device, more particularly, to a method of manufacturing a bipolar transistor operating at a low temperature such as liquid nitrogen temperature (77 K).

2. Description of the Related Art

At a low temperature, the characteristics of MOS transistor is improved and wiring resistance is decreased. The decrease of wiring resistance is effective to improvement of operation speed of a bipolar LSI and a MOS LSI operating at low temperature such as liquid nitrogen temperature has been developed. In a BiCMOS LSI in which a bipolar transistor and a MOS transistor are formed on the same chip, the bipolar transistor needs to have a large drive capability because wiring capacitance is not decreased even at low temperature.

The characteristic of the bipolar transistor at low temperature is quite different from that of the bipolar transistor at room temperature. Phenomena such as bandgap narrowing and carrier freeze-out are caused at low temperature.

It is reported by Johannes M. C. Stork et al. in "Base Profile Design for High-performance operation of Bipolar Transistors at Liquid-Nitrogen" that the carrier freeze-out phenomenon is caused in semiconductor at low temperature so that the resistivity increases if the doping level is less than $1\times10^{18}$ cm$^{-3}$. In order to prevent the carrier freeze-out phenomenon, the doping level must be high. On the other hand, when the doping level is high, the amount of bandgap narrowing is increased at low temperature. In an n-p-n type of transistor, in a case where the acceptor doping level is high in the base layer, when the emitter layer is formed in the base layer through impurity diffusion, the acceptor doping level in the emitter layer is increased, so that the amount of bandgap narrowing in the emitter layer is larger because of the donor doping level and the diffused acceptor doping level than that estimated based on only the donor doping level. As a result, the difference of bandgap narrowing amount between the emitter layer and the base layer becomes great so that $h_{FE}$ is decreased with temperature becomes lower.

Even in a conventional transistor structure, if the doping level in the base layer is increased to that in the emitter layer, the reduction of $h_{FE}$ at low temperature can be prevented because the difference between the emitter layer and the base layer in the bandgap narrowing amount can be made small. This is also reported in the above paper by Stork et al. The inventor of the present invention fabricated and examined samples based on the teaching of the above paper. In the paper, the emitter layer is formed using standard LPCVD polysilicon deposition, arsenic ion implantation and diffusion. In the samples, an n$^+$-type buried layer and an n-type epitaxial layer (a collector layer of a bipolar transistor) are formed on a p-type silicon substrate and a base layer is formed which is composed of a p-type epitaxial layer selectively grown on the epitaxial layer at a low temperature in a range of 450° to 700° C. The impurity distribution profile of one of the samples is shown in FIG. 1. The doping level of n-type impurity in the emitter layer is $1\times10^{20}$ cm$^{-3}$ and the base layer has the boron doping level of $2\times10^{19}$ cm$^{-3}$ and 55 nm in thick. If the base layer is formed using ion implantation, the impurity distribution becomes so wider that a low doping level region is formed. As a result, carrier are frozen out in such a low doping level region, resulting in increased base resistivity. Since the bandgap narrowing amount is influenced by both the donor doping level and the acceptor doping level in a semiconductor, the actual amount $\Delta E_{ge}$ is greater than that estimated in consideration of only the donor doping level. Thus, when the bandgap narrowing amount $\Delta E_{ge}$ in the emitter layer having a high doping level is greater the bandgap narrowing amount $\Delta E_{gb}$ in the base layer having a low doping level, the number of minority carriers injected from the base layer to the emitter layer would increase with temperature being decreased. In the samples, when the bandgap narrowing amounts are measured, $\Delta E_{ge}$ was 96 meV and $\Delta E_{gb}$ was 95 meV. This is reported in "Measurement of Steady-state Minority-Carrier Transport in Heavily doped n-Type Silicon" (IEEE Transactions on Electron Device, Vol. ED-34, pp. 1580–1589, 1987) by J. A. Del Alamo et al. and in "Measurement of Electron Lifetime, Electron Mobility and Band-gap Narrowing in Heavily Doped p-type silicon" (Digest of International Device Meeting, PP. 24–27, 1986) by S. E. Swirhun et al.

The dependency of $h_{FE}$ upon temperature of the samples was measured. The measuring result is shown in FIG. 17 and $h_{FE}$ is decreased with temperature being decreased. Also, as shown in FIG. 2, the cut-off frequency $f_T$ is decreased at low temperature (89 K) compared to that at room temperature (300 K). This is because the emitter traveling time increases due to the decreased $h_{FE}$. In this case, $h_{FE}$ is expressed by the following equation (1)

$$h_{FE}=(W_E \cdot N_E \cdot D_{nB}/W_B \cdot N_B \cdot D_{pE})\exp\{(\Delta E_{ge}-\Delta E_{gb})/kT\} \qquad (1)$$

where $N_E$ is a doping level in the emitter layer, $N_S$ is a doping level in the base layer, $D_{pE}$ is a diffusion coefficient of a hole in the emitter layer, $D_{nB}$ is a diffusion coefficient of an electron in the base layer, $W_E$ is a thickness of the emitter layer, $W_B$ is a thickness of the base layer, k is a Boltzmann constant, and T is an absolute temperature. The great decrease of $h_{FE}$ at low temperature makes the emitter traveling time increase, resulting in the decreased cut-off frequency $f_T$.

Recently, in order to solve the problems, there have been proposed bipolar transistors having new structures. For instance, a heterojunction bipolar transistor in which material having a narrow bandgap such as silicon-germanium is used for the base layer, is proposed as the first example in "Low Temperature Operation of Si and SiGe Bipolar Transistor" (IEEE IEDM Technical Digest, pp. 17–20, 1990) by E. F. Grabbé. Although this transistor shows high $h_{FE}$ even at low temperature, $f_T$ abruptly decreases in a high collector current region due to the heterojunction between the base and the collector, so that the transistor cannot be used in a circuit operating in a high current region such as BiCMOS. This is reported in "Profile Scaling Constraints for Ion-Implanted and Epitaxial Bipolar Technology Designed for 77 K Operation" (IEEE IEDM Technical Digest, pp. 861–864, 1991) by J. D. Cressler et al.

As the second example, a pseudo-heterojunction bipolar transistor (HBT) having an emitter doping level lower than a base doping level is proposed in "Base-Emitter Injection Characterization in Low-Temperature Pseudo-Heterojunction Bipolar Transistor" (IEEE Transactions on Electron Device, vol. 37, No. 10, pp. 2222–2229, 1990) by K. Yano et al. In this case, the bandgap narrowing amount $\Delta E_{gb}$ of the base layer having a high doping level is greater than that $\Delta Eg_e$ of the emitter layer having a low doping level, so that $h_{FE}$ is improved. However, in this example, because the emitter doping level needs to be lower than that in a conventional transistor, there is caused another problem of emitter resistance increasing.

The conventional bipolar transistors studied for low temperature operation was described. A conventional bipolar transistor not for low temperature operation (JP-A-Hei 4-99328) will be described with reference to an impurity distribution profile shown in FIG. 3. After a n⁺-type buried layer and a n-type epitaxial layer (a collector layer of a bipolar transistor) are formed on a p-type silicon substrate, a p-type base layer is formed using an ion injection method (or an MBE method). FIG. 3 shows the impurity distribution profile of a bipolar transistor using the ion injection method. This base layer includes a first base layer having a high peak doping level of $1 \times 10^{18}$ to $5 \times 10^{18}$ cm$^{-3}$ and a second base layer having a low peak doping level of $2 \times 10^{16}$ to $1 \times 10^{17}$ cm$^{-3}$. An n⁺-type emitter layer having a surface doping level of $1 \times 10^{20}$ to $1 \times 10^{21}$ cm$^{-3}$ is formed on a part of the second base layer. As shown in FIG. 3, because the emitter layer of the high doping level does not contact the first base layer of high doping level, an electric field in a depletion layer when a backward voltage is applied between the emitter layer and the base layer is weakened so that the generation of hot carries is suppressed. However, in this example, because the total thickness of the base layers is thick due to the second base layer so that the base traveling time required for electrons to pass through the base layers becomes long, the cut-off frequency $f_T$ decreases. In addition, an electric field is generated between the first and second base layers because of the difference therebetween in the doping level. This electric field acts to suppress the electron traveling in the base layers to increase the base traveling time. Further, because the second base layer is of a low doping level, the resistance of an intrinsic base layer below the emitter layer increases due to the freeze-out at low temperature.

A bipolar transistor in which the low temperature operation is considered is disclosed in JP-A-Hei5-129315. FIGS. 4 and 5 show the cross sectional view and the impurity distribution profile of the transistor. This transistor has an inversely graded base impurity distribution profile in which the doping level of a base layer on a collector layer side is higher than that on an emitter layer side. The base doping level $N_{BC}$ on the collector layer side is $3 \times 10^{19}$ cm$^{-3}$ and the base doping level $N_{BE}$ on the emitter layer side is $3 \times 10^{18}$ cm$^{-3}$. When a base layer width is 100 nm, an inverse electric field, i.e., an electric field which acts to back electrons from the collector layer side to the emitter layer side in the base layer is generated due to the difference in pseudo-fermi levels produced from the difference in the doping level. In this case, the electric field E1 is expressed by the following equation (2).

$$E1 = N_{BC}^{-1} \times (kT/q) \times (dN_B/dX) \qquad (2)$$
$$= N_{BC}^{-1} \times (kT/q) \times \{(N_{BC} - N_{BE})/W_B\}$$

where T is an absolute temperature (K), k is the Boltzmann constant ($1.38 \times 10^{-23}$ J/K), and q is a charge an electron ($1.6 \times 10^{-19}$ C). E1 is 2,331 KV/cm at room temperature and 0.598 KV/cm at liquid nitrogen temperature. On the other hand, a forward electric field E2 is generated because of the difference between the collector and emitter layer sides in the bandgap narrowing amount which is generated due to the base layer doping level distribution, to accelerate electrons from the emitter layer side to the collector layer side in the base layer. The bandgap narrowing amounts $\Delta E_{gb1}$ and $\Delta E_{gb2}$ are respectively 103 meV and 62 meV for $N_{BC} = 3 \times 10^{19}$ cm$^{-3}$ and $3 \times 10^{18}$ cm$^{-3}$ and in this case E2 is determined as follows.

$$E2 = (1/q) \times \{(d\Delta E_{gb}/2)dX\} \qquad (3)$$
$$= (1/q) \times \{(\Delta E_{gb1} - \Delta E_{gb2})/2\}/W_B$$

where the bandgap narrowing amount of the conduction band in which electrons travel is assumed to be a half of the total bandgap narrowing amount. E2 is not dependent upon temperature and is 2.05 KV/cm. For this reason, E1 is greater than E2 at room temperature so that the inverse electric field acts against electrons. However, E1 becomes small as temperature falls and the forward electric field acts to accelerate electrons at 264 K or below, so that electron base traveling time is shortened to increase the cut-off frequency $f_T$. "Ultra high speed bipolar device", T Sugano, p. 37, published by Baihuukan is referenced to for the equation (2) and "Reduction of $f_T$ by Nonuniform Base Bandgap Narrowing" by S. Szeto et al. (IEEE Electron Device Letters, Vol. 10, pp. 341–343, 1989) is referenced to for the equation (3). The bandgap narrowing amount of the base layer is calculated based on the above "Ultra High Speed Bipolar Device".

In a recent high speed bipolar transistor, high concentration impurity is doped in the collector layer to suppress Kirk effect due to which $f_T$ is dropped at a high current region. However, if the entire collector layer is highly doped, a junction capacitor between the collector layer and the base layer increases to prevent the high speed operation. For this reason, Selectively Ion Implanted Collector (SIC) structure is employed in which ion implantation is selectively performed for the collector layer straightly below the emitter layer to form a high doping level region.

Even in the above low temperature operating semiconductor device disclosed in the JP-A-hei5-129315, the SIC structure is required in order to suppress the Kirk effect. Generally, the ion implantation for the SIC structure is performed after the base layer is formed, as disclosed in JP-A-Sho63-107167. As a result of our experiment, if ion implantation is performed after the base layer having the inversely graded impurity distribution is epitaxially grown, i.e., if the collector layer impurity is highly injected in the base layer, the improvement of $f_T$ at low temperature is almost not achieved unlike disclosure of JP-A-Sho63-107167. The impurity distribution profile of a transistor used in this experiment is shown in FIG. 6 and the temperature dependencies of $f_T$ and $h_{FE}$ are shown in FIGS. 7 and 8. In a transistor in which the SIC injection is performed after the base layer is epitaxially grown, $f_T$ and $h_{FE}$ at 77 K drop compared to those at room temperature regardless of impurity distribution profile, i.e., even in a box-shape impurity profile and even in the inversely graded impurity distribution profile. This is because if phosphorus ions are injected in the base layer containing boron ions as impurity for the SIC structure, the phosphorus ions form a donor level to trap electrons traveling in the base layer. This phenomenon becomes remarkable as temperature drops so that $f_T$ and $h_{FE}$ are fallen down. For this reason, the inversely graded impurity distribution effect is almost hidden at low temperature.

Another method of forming the SIC structure is disclosed in JP-A-Hei4-315438 which relates to a bipolar semiconductor integrated circuit device. The low temperature operation is not considered in this device. In this method, after the SIC structure is formed, the base layer is formed using epitaxial growth method, the degradation of crystallization of the base layer due to the SIC injection can be prevented.

As disclosed in the JP-A-Hei4-315438, the drop of $f_T$ and $h_{FE}$ due to the trapping is not caused at low temperature when the donor level is not formed in a case of transistor which the SIC injection is performed prior to the base epitaxial growth, i.e., impurity for the collector layer is not injected into the base layer. The impurity distribution profile of the transistor used in the test is shown in FIG. 9 and the temperature dependencies of $f_T$ and $h_{FE}$ are shown in FIGS. 10 and 11. In the transistor having a conventional box-shaped impurity distribution profile in which the SIC injection is performed after the base layer is formed, $h_{FE}$ decreases as the temperature decreases. However, in a transistor in which the SIC injection is performed before the base layer is formed, the drop of $h_{FE}$ is suppressed in a great extent even at 77K. The same result is obtained with respect to $f_T$. However, the low temperature operating transistor cannot be achieved by only the performing the SIC injection before the base layer is formed.

In the JP-A-Hei5-129315, a polysilicon layer is formed on the epitaxial base layer. When the polysilicon layer is etched, the base layer would also be etched. Therefore, in order to increase $f_T$, it would be difficult to make the base layer thin. In addition, in the JP-A-Hei 4-315438, the transistor structure expands in a lateral direction. Therefore, the scaling in the lateral direction would be difficult.

SUMMARY OF THE INVENTION

Accordingly, an object of the present invention is to provide a method of manufacturing an improved bipolar transistor operating at a low temperature.

Another object of the present invention is to provide a method of manufacturing a bipolar transistor having high $h_{FE}$ at a low temperature.

Still another object of the present invention is to provide a method of manufacturing a bipolar transistor having high $f_T$ at a low temperature.

Yet another object of the present invention is to provide a method of manufacturing a bipolar transistor having a high drive capability at a low temperature.

A method of manufacturing a bipolar transistor according to the present invention, includes the steps of:

forming a collector region having a first impurity concentration;

selectively doping impurities having a conductivity equal to that of the collector region into said collector region to change a portion of said collector region to an impurity-concentration-enhanced portion thereby having a second impurity concentration higher than the first impurity concentration, a remaining portion of said collector region maintaining to have the first impurity concentration;

growing, after the impurity-concentration-enhanced portion is formed, a base region on surfaces of the impurity-concentration-enhanced portion and a part of the remaining portion of the collector region such that the base region has an inversely graded impurity distribution profile in which an impurity concentration of a bottom surface portion thereof facing with said impurity-concentration-enhanced portion is higher than an impurity concentration of a top surface portion opposite to the bottom surface portion thereof; and selectively forming an emitter region in the top surface portion of the base region.

BRIEF DESCRIPTION OF THE DRAWINGS

The above and other objects, feature and advantages of the present invention will be more apparent from the following description taken in conjunction with the accompanying drawings, in which.

DETAILED DESCRIPTION OF THE PREFERRED EMBODIMENTS

Referring now to FIGS. 12A to 12D, the description will be made on the method of manufacturing a low temperature operating bipolar transistor according to the first embodiment of the present invention.

Figure 12A:
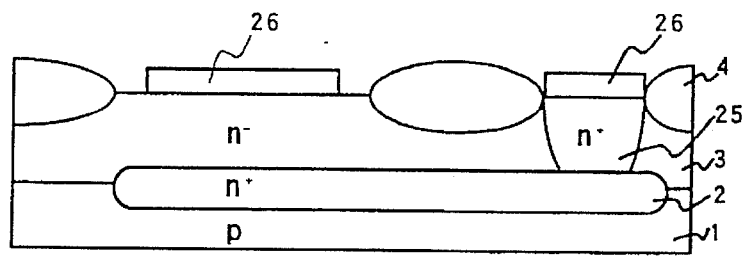
FIGS. 12A to 12D are cross sectional views indicative of a method of manufacturing a bipolar transistor according to a first embodiment of the present invention.

As shown in FIG. 12A, an n-type buried layer 2 is selectively formed in a p-type silicon substrate 1 by implanting arsenic ions into the substrate 1 at high doping amount. An n⁻-type silicon epitaxial layer 3 serving as a collector layer is then grown on the substrate 1 having the buried layer 2. The layer 3 contains phosphorous as an impurity at a concentration of $2 \times 10^{17}$ cm$^{-3}$. The layer 3 is then selectively oxidized to form field silicon oxide layers 4, followed by forming an n+-type collector electrode contact region 25. Next, a silicon oxide film of 100 nm in thick is formed over the entire surface and then patterned to leave oxide films 26 on the collector contact region 25 and on a base region to be formed.

Figure 12B:
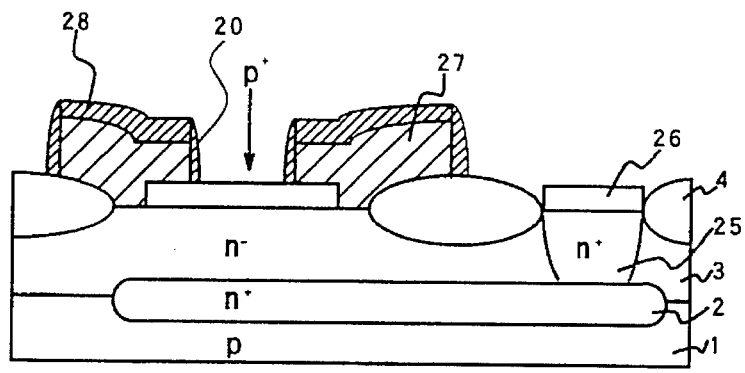

Next, as shown in FIG. 12B, a polysilicon layer doped with p-type impurities is grown over the entire surface and then patterned by using silicon nitride films 28 as a mask. A p-type polysilicon base electrode 27 is thereby formed. A silicon nitride film is then further deposited on the entire surface and a dry etching process is performed to form side wall nitride films 20. In this step, the epitaxial layer 3 is not etched or damaged due to the existence of the oxide film 26 on the epitaxial layer 3.

Figure 12C:
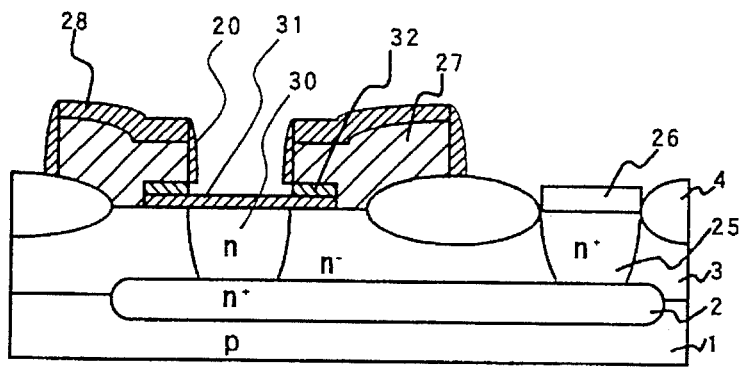
Figure 13:
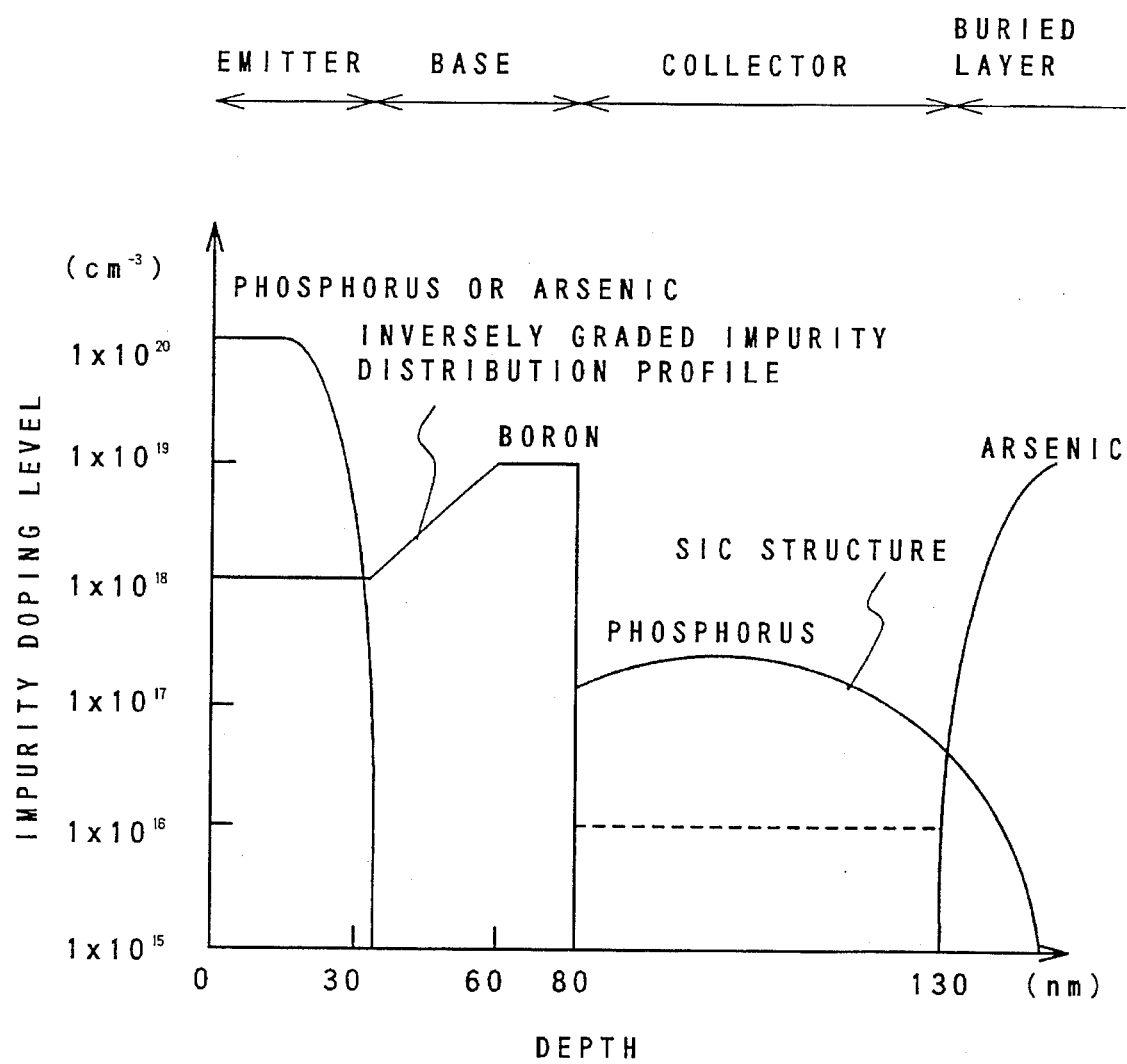
FIG. 13 shows an impurity distribution profile of the bipolar transistor according to the first embodiment.

Thereafter, as shown in FIG. 12C, phosphorus ions are implanted into the n⁻-type epitaxial layer 3 through the oxide film 26 with the energy of 100 to 400 KeV and at dosing amount of $1\times10^{12}$ to $5\times10^{12}$ cm$^{-2}$ to form an n-type SIC region 30. This ion implantation condition is determined based on the thickness of the oxide film 26 and the doping level of the SIC region 30. Heat treatment is then performed to activate the impurity ions in the SIC region 30. The oxide film 26 is thereafter removed, followed by carrying out silicon epitaxial growth by use of the ultrahigh vacuum chemical vapor deposition (UHV-CVD) method in which an epitaxial layer is grown at a low temperature of a range of 450° to 800° C. Moreover, the UHV-CVD method causes selective epitaxial growth to form a silicon layer on only exposed portions of silicon layer. As a result, a monocrystalline silicon of 80 nm is grown on the surface of the SIC region 30 and the layer 3 not covered with polysilicon layer 27, whereas a p-type polysilicon layer 32 is grown from a portion of the p+-type base polysilicon electrode layer 27 where the polysilicon is exposed. The epitaxial growth is continued until polysilicon layer 32 and the p-type base layer 16 are in contact with each other. During the UHV-CVD, the doping amount of boron is controlled such that the base layer 31 has an inversely graded impurity distribution profile in which the doping level of boron in the base layer 31 is decreased gradually from the bottom surface contacting with the SIC region 30 to the top surface, as shown in FIG. 13. Moreover, the peak level of boron concentration is designed to be $1\times10^{19}$ cm$^{-3}$ and the lowest level thereof is designed to be $1\times10^{18}$ cm$^{-3}$, as also shown in FIG. 13.

Figure 12D:
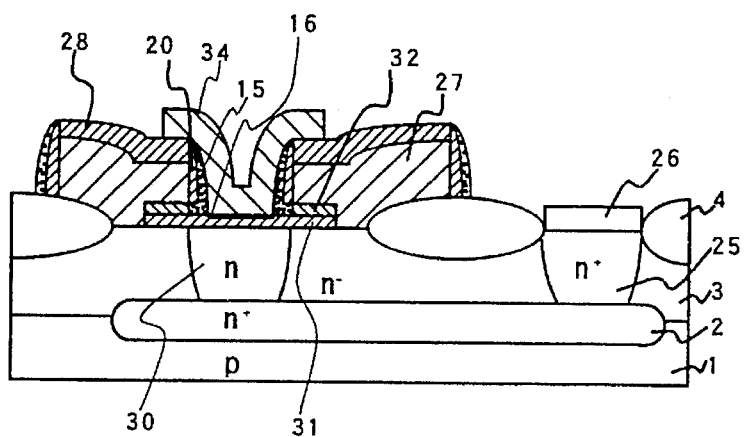

Next, as shown in FIG. 12D, a silicon oxide film is grown by the CVD method and patterned using anisotropic dry etching and wet etching to form silicon oxide side walls 15. A part of the base region is thereby exposed in which an emitter region is to be formed. Thereafter, polysilicon electrode layer doped with phosphorus or arsenic ions is deposited and patterned to form an n+-type emitter polysilicon electrode 34. Lamp annealing is then performed at 850° to 1000° C. for short time (5 to 20 seconds) to form an n+-type emitter layer 16. Since the heat treatment for forming the emitter region 16 is performed at a relatively low temperature and for short time in the above manner, the rediffusion of boron in the base region 31 is suppressed not to distort the impurity distribution profile thereof.

Thereafter, emitter, base and collector metal electrodes and wirings made of, for example, aluminium are formed in a manner as well in the art to fabricate the bipolar transistor.

Turning to FIG. 13, the bipolar transistor fabricated by the method as shown in FIGS. 12A to 12D has an impurity distribution profile straightly below the emitter. The emitter region 16 is formed with the impurity concentration of about $1\times10^{20}$ cm$^{-3}$, and the n-type SIC region 30 has a doping level higher by one order than the collector layer 3. As mentioned before, the base region 16 has an impurity distribution profile in which the doping level on the SIC region 30 side ($1\times10^{19}$ cm$^{-3}$) is higher than that on the emitter layer 16 side ($1\times10^{18}$ cm$^{-3}$). The doping level at every portion of the base layer is higher than the Mott's doping level of $1\times10^{18}$ cm$^{-3}$ so that carriers are not influenced in the base layer by the freeze-out phenomenon.

Figure 14:
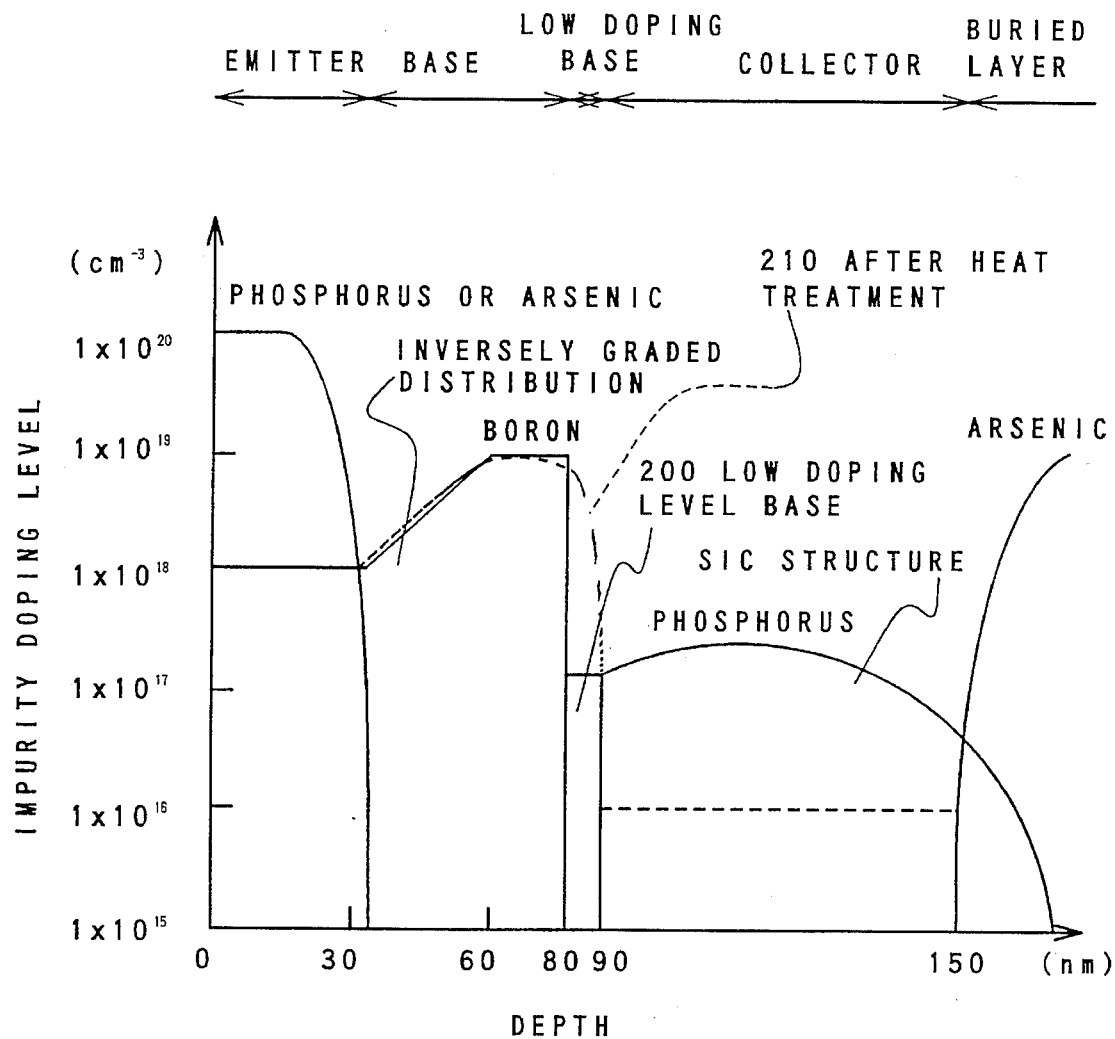
FIG. 14 shows an impurity distribution profile indicative of a modified version of the bipolar transistor shown in FIGS. 12A to 12D.

Referring to FIG. 14, there is illustrated an impurity distribution profile of a bipolar transistor according to a modification of the transistor shown in FIGS. 12A to 12D and 13. In the present transistor, a lightly-doped base region 200 is first formed on the SIC region 30 and the part of the collector region 3 and thereafter the base region 16 is formed on the region 200. The lightly-doped base region 200 has a thickness of 5 to 20 nm and an impurity concentration of $2\times10^{17}$ cm$^{-3}$ or below. The heat treatment is then carried out to obtain an actual base impurity distribution profile as shown by a line 210 in FIG. 14.

Also in this modification the doping level of the n-type SIC region is higher by one or more orders than that of the other region of the collector layer and is designed to be $2\times10^{17}$ cm$^{-3}$ which is higher by one order than that ($1\times10^{16}$ cm$^{-3}$) of the collector layer other than a portion immediately below the emitter layer. The lightly-doped base layer 200 acts as a buffer for preventing phosphorus ions doped in the SIC region from being diffused into the p-type base layer by diffusing boron ions doped in the p-type base layer 31 through heat treatment after the base layer is formed. By providing this base layer 200, a heat treatment margin after the base layer has been formed is greater than the previous embodiment.

Figure 15:
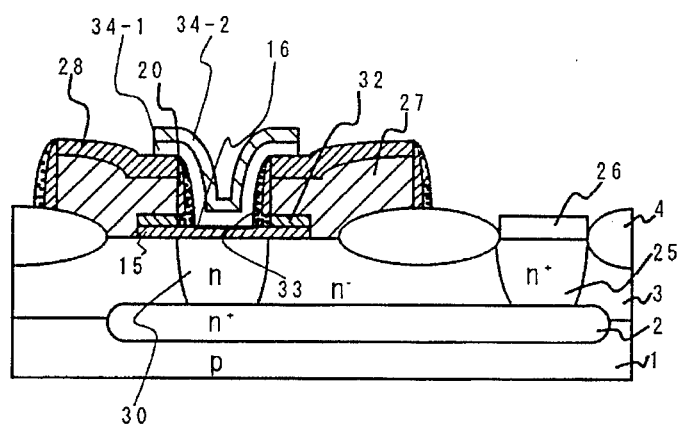
FIG. 15 is a cross sectional view illustrative of a bipolar transistor according to a second embodiment of the present invention.
Figure 4:
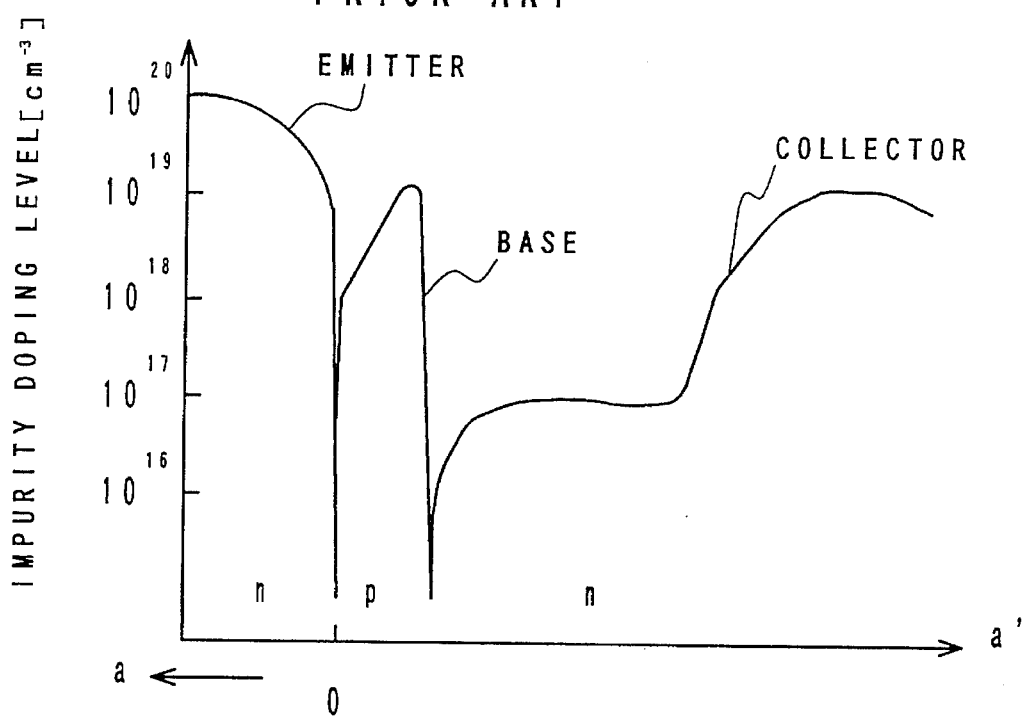
FIG. 4 shows an impurity distribution profile in a third conventional bipolar transistor.
Figure 5:
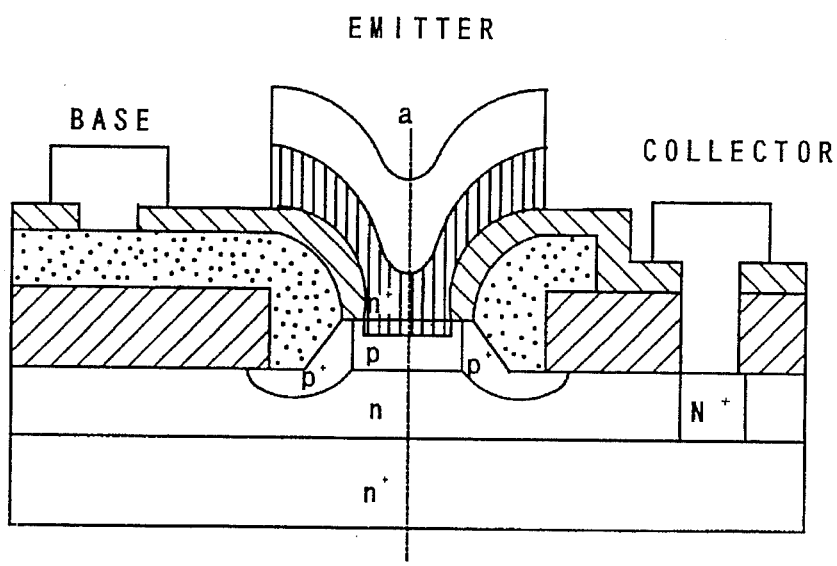
FIG. 5 is a cross sectional view of the third bipolar transistor shown in FIG. 4.
Figure 6:
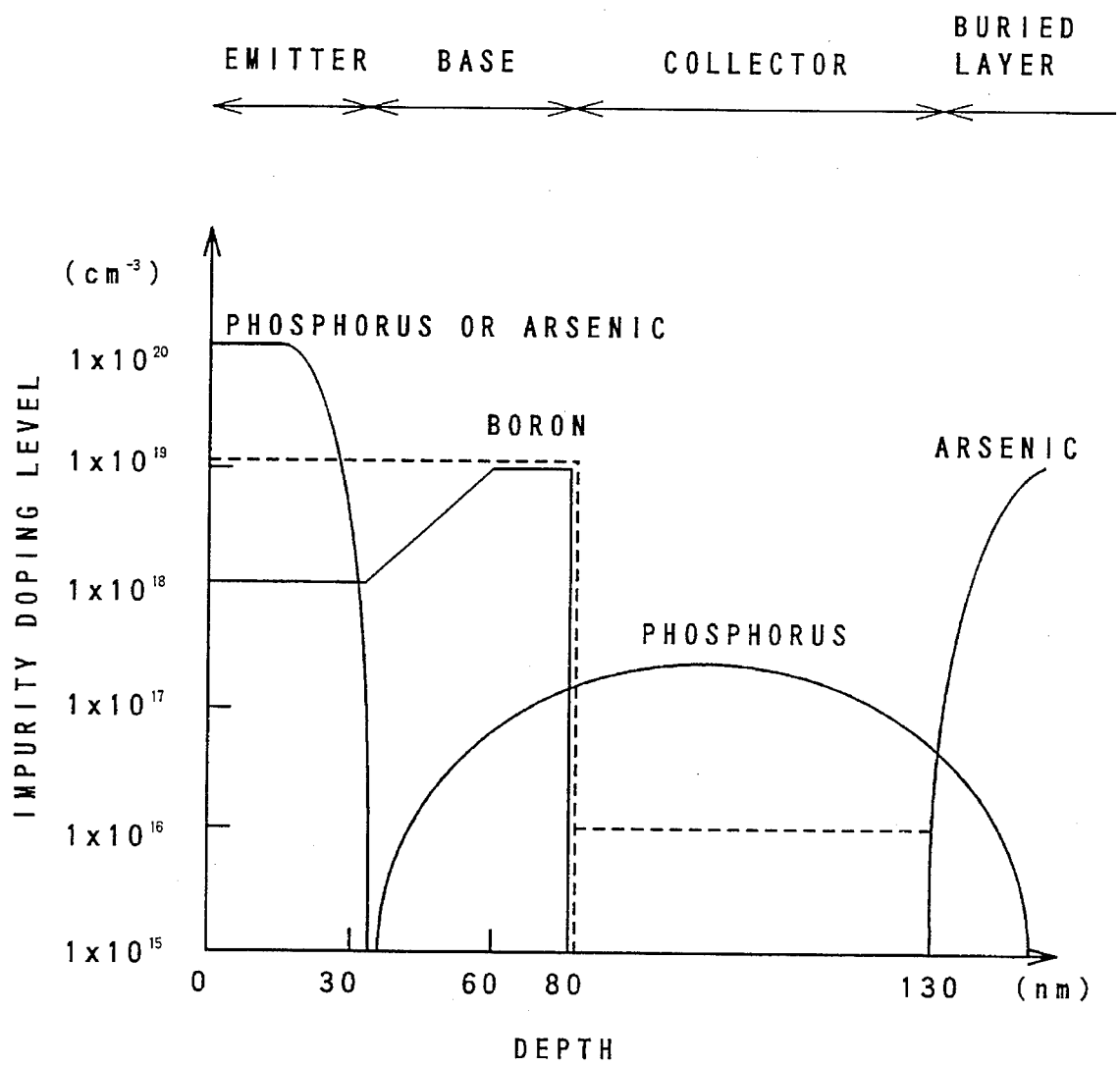
FIG. 6 shows an impurity distribution profile in a fourth conventional bipolar transistor.
Figure 7:
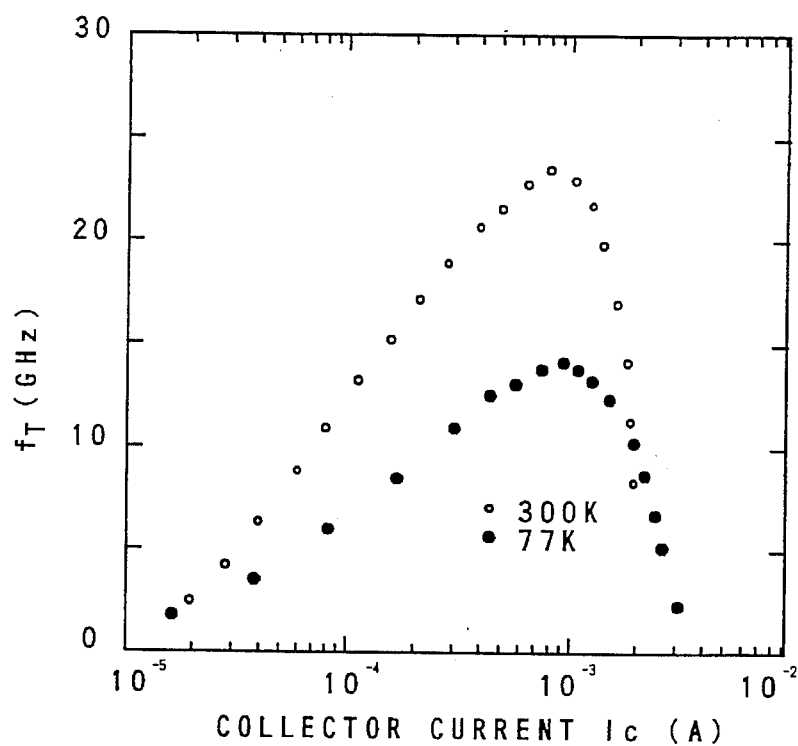
FIG. 7 is a graph showing a relation between the cut-off frequency $f_T$ and collector current $I_c$ in the bipolar transistor shown in FIG. 6.
Figure 8:
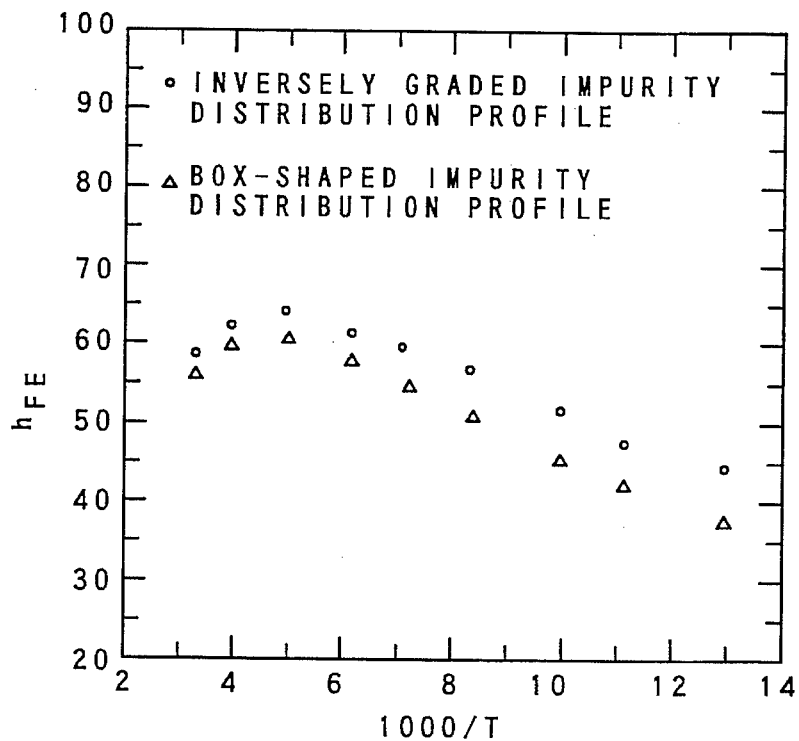
FIG. 8 is a graph showing a relation between the current amplification factor $h_{FE}$ and temperature in the bipolar transistor shown in FIG. 6.
Figure 9:
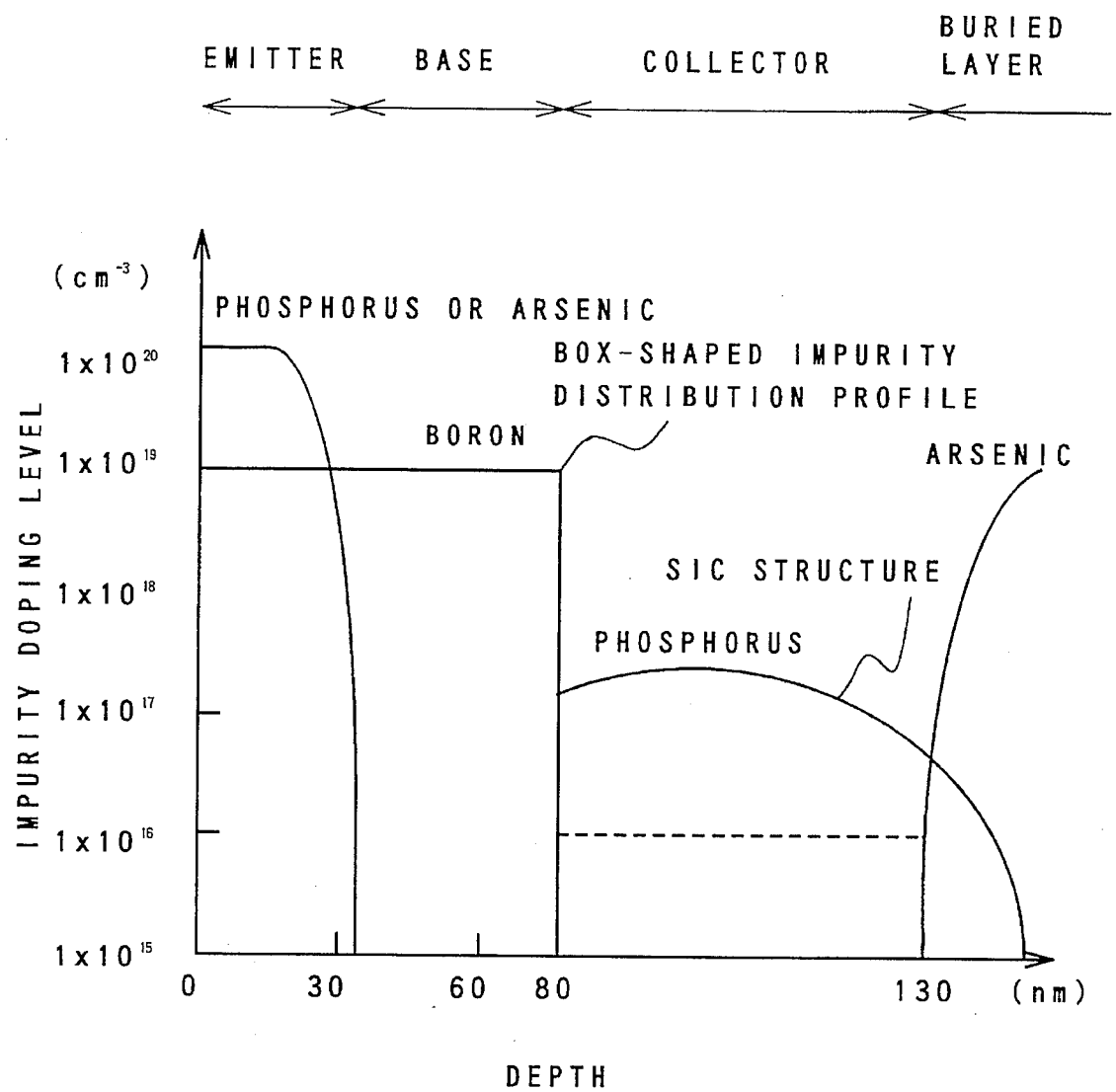
FIG. 9 shows an impurity distribution profile of a bipolar transistor used in an experiment.
Figure 10:
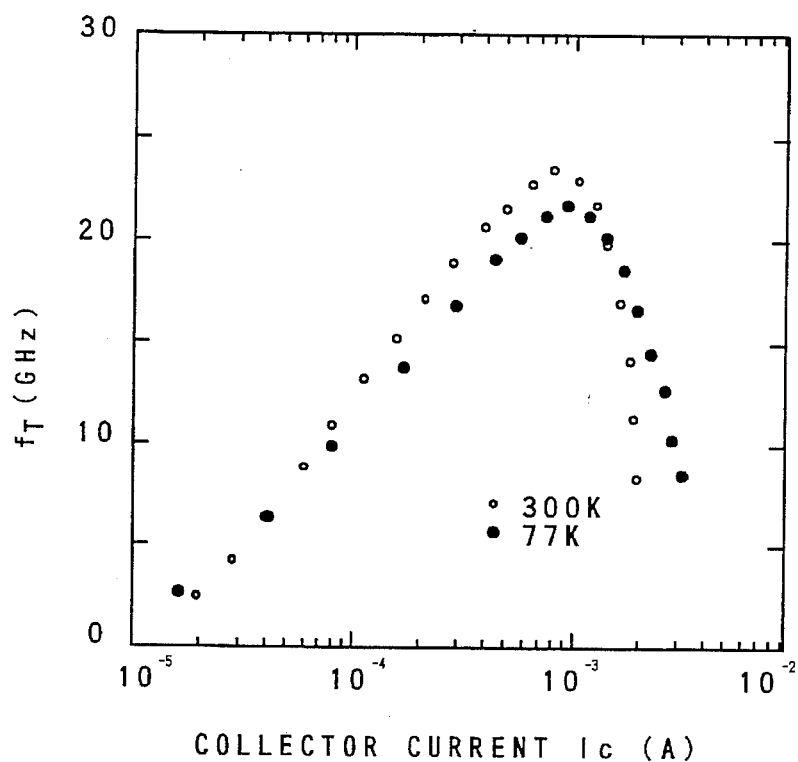
FIG. 10 is a graph showing a relation between the cut-off frequency $f_T$ and collector current $I_c$ at 300 K and 77 K in the bipolar transistor shown in FIG. 9.
Figure 11:
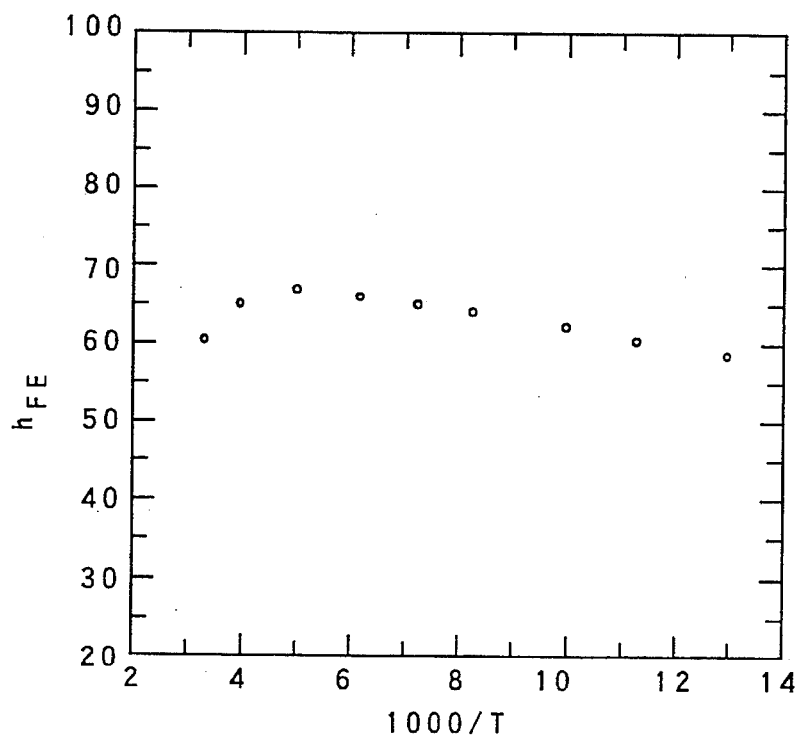
FIG. 11 is a graph showing a relation between the current amplification factor $h_{FE}$ and temperature in the bipolar transistor shown in FIG. 9.

Turning to FIG. 15, a transistor according to the second embodiment has two layers 34-1 and 34-2 as the emitter electrode layer in this modification. For instance, the layer 34-1 is the non-doped polysilicon layer and the layer 34-2 is the highly doped polysilicon layer. The layer 34-1 may be slightly doped. In this embodiment, the diffusion length of impurity in the emitter electrode layer due to the lamp annealing (heat treatment) can be controlled by adjusting the thickness of the layer 34-1.

Referring to FIG. 16, the description will be made below on the third embodiment of the present invention.

Figure 16A:
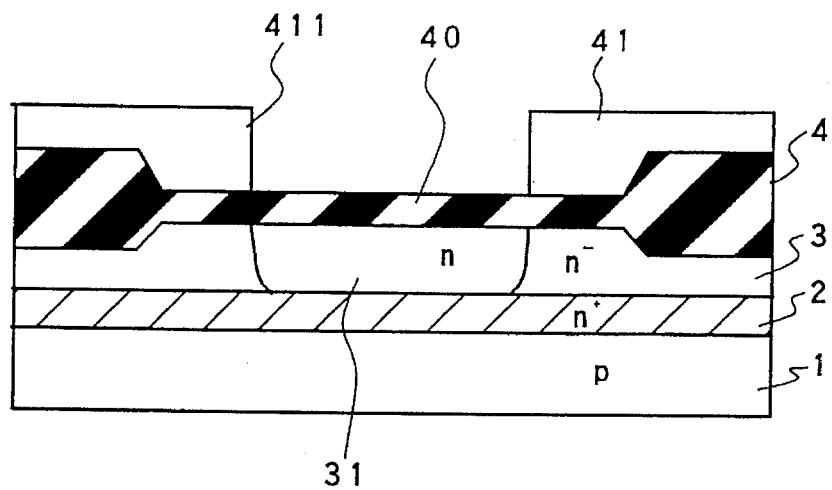
FIGS. 16A to 16E are cross sectional views indicative of a method according to a third embodiment of the present invention.

As shown in FIG. 16A, arsenic ions are implanted into a p-type silicon substrate 1 to form the n+-type buried layer 2. An n-type epitaxial layer 3 including phosphorus ions at a concentration of $2\times10^{17}$ cm$^{-3}$ serving as a collector layer is then grown on the buried layer 2 by the CVD method at a temperature from 1000° to 1150° C. Next, the layer 3 is selectively oxidized to form a field oxidation film 4 defining an area on which a base region is to be formed. This area is thereafter covered with a silicon oxide film 40. A photoresist layer 41 is then formed and patterned to have a hole 411. Next, phosphorus ions are selectively implanted into the layer 3 through the hole 411 of the photoresist layer 41, followed by an annealing process to activate the phosphorus ions thus implanted. An SIC region 31 is thereby formed which has an impurity concentration higher than that of the collector region 3.

Figure 16B:
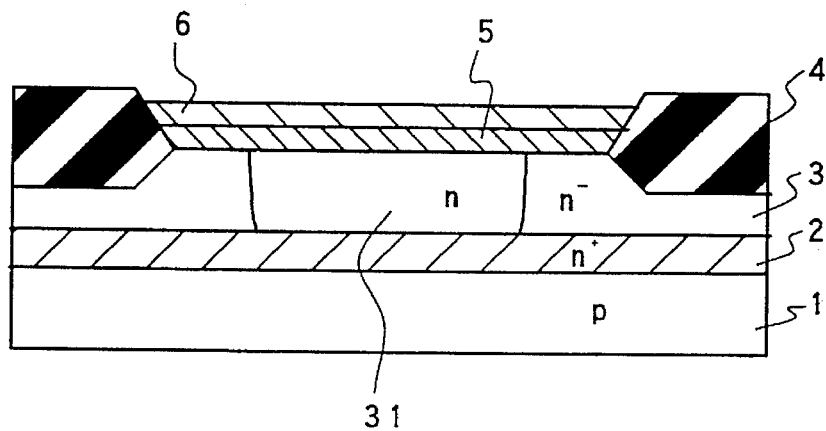

As shown in FIG. 16B, the photoresist layer 41 and the oxide film 40 are removed to expose the area defined by the field oxide layer 4. A first silicon layer 5 doped with boron at a high concentration and having a thickness of 30 nm and a second silicon layer 6 doped also with boron at a low concentration and having a thickness of 25 nm are selectively epitaxially grown on the surface of area defined by the field oxide layer 4. These epitaxial layers are grown at a low temperature of 450° to 700° C. using the UHV-CVD. In this case, the above "low temperature" means that the growth temperature is low compared to the epitaxial layer growth temperature of 1000° to 1150° C. of the collector layer 3.

Figure 16C:
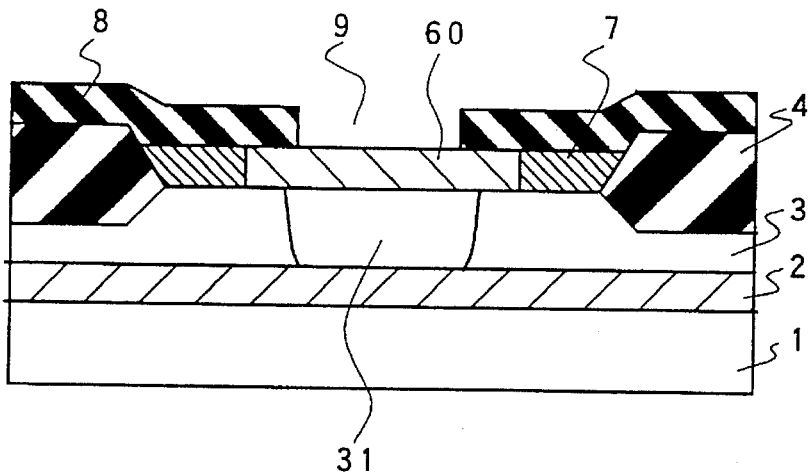

Subsequently, a heat treatment is carried out to make boron impurity contained into the layer 5 diffuse into the layer 6. As a result, as shown in FIG. 16C, a base region 60 is formed with the inversely graded impurity distribution profile, similarly to the base region 31 as shown in FIG. 12A to 12D. In other words, the heavily-doped layer 5 and the lightly-doped layer 6 are employed to form the base region 60 having the inversely graded impurity distribution profile. If desired, three or more epitaxial layers can be used to form the base region having the inversely graded impurity distribution profile.

The base region 60 is then selectively covered with a mask layer such as a photoresist film (not shown) and boron ions are selectively implanted into the base region 60 with energy of 10 to 30 KeV and at a dosing amount of $1\times10^{15}$ to $1\times10^{16}$ cm$^{-2}$ to form p$^+$-type external base layers 7. Then, a silicon oxide film 8 of 100 nm is formed by CVD and patterned to form an opening 9 to expose a portion of the base region 60 into which an emitter region is to be formed.

Figure 16D:
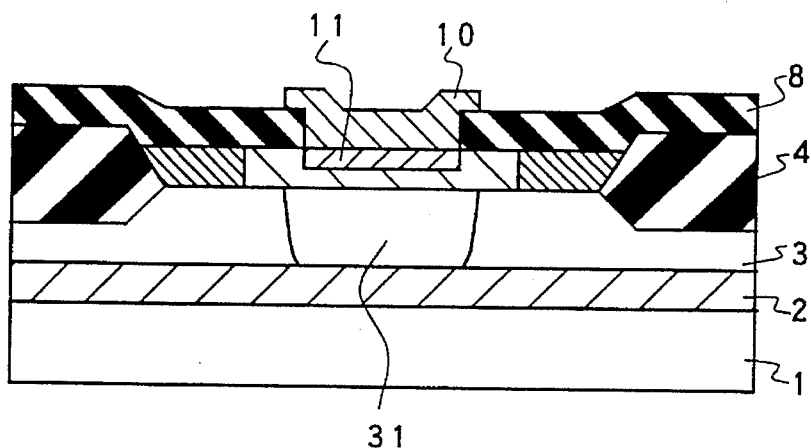

As shown in FIG. 16D, a polysilicon film having a thickness of 100 to 300 nm and including phosphorus or arsenic at a concentration of $5\times10^{19}$ to $1\times10^{21}$ cm$^{-3}$ is grown and patterned to form an emitter electrode 10. Then, fast heat treatment is executed at a temperature of 700° to 1000° C. for 3 to 20 seconds to diffuse the impurities from the emitter electrode 10 into the base region 60. An emitter region 11 is thus formed in the base region 60.

Figure 16E:
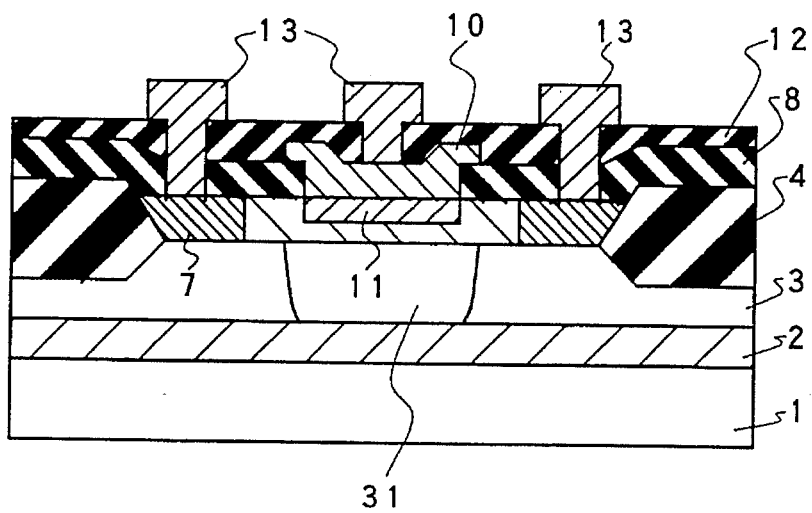

Next, as shown in FIG. 16E, an interlayer insulating film 12 such as a silicon oxide film and/or a silicon nitride film is formed over the all surface, openings are then selectively formed therein. Aluminium wirings 13 for emitter and base electrodes and also for a collector electrode (not shown) are formed to complete the bipolar transistor.

In the transistor of the present embodiment thus formed, the base region has the doping level of $5\times10^{18}$ cm$^{-3}$ or more at the interface with the SIC region 31 and that of about $1\times10^{18}$ cm$^{-3}$ at the interface with the emitter region 11, so that carrier are not influenced by the freeze-out phenomenon. In addition, the influence to the bandgap narrowing of the emitter layer is made small.

Figure 17:
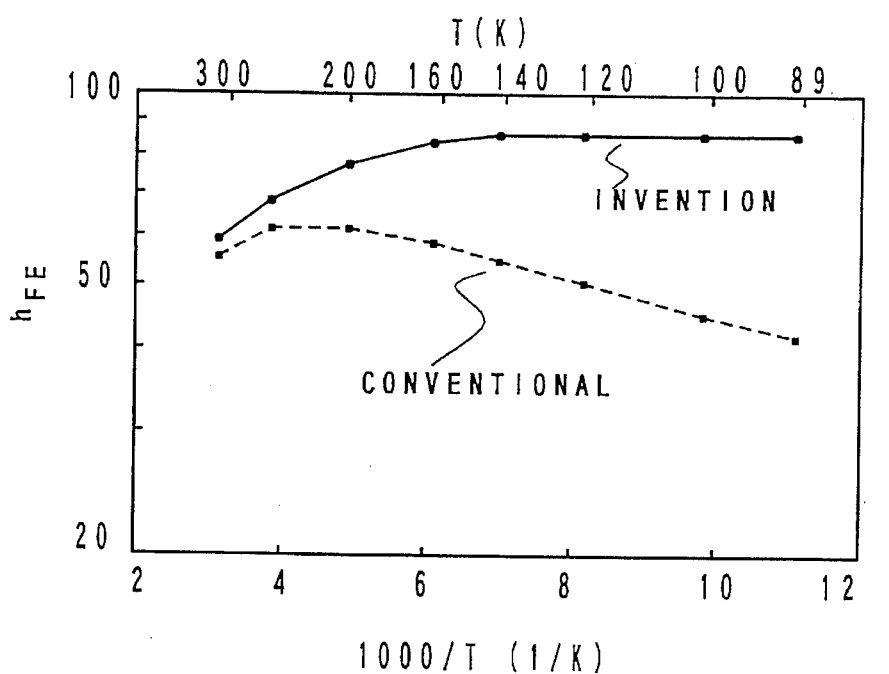
FIG. 17 is a graph showing a relationship between the current amplification factor $h_{FE}$ and temperature in the bipolar transistor according to the embodiments of the present invention.

Turning to FIG. 17, there is shown a measuring result of temperature dependency of $h_{FE}$ in a transistor having the impurity distribution profile according to the above embodiments. The $h_{FE}$ rises in a range of 300 to 120 K and is held at the high level of about 90 in a temperature range of 120 to 89 K. As a result, there can be obtained the high current amplification factor at 89 K 2.2 times as high as that of a transistor having a conventional impurity distribution profile shown in the dot line. This is the reason why the low acceptor doping level in the emitter layer makes small the bandgap narrowing amount $\Delta E_{ge}$ of the emitter layer so that the temperature dependency of $h_{FE}$ is improved.

Figure 1:
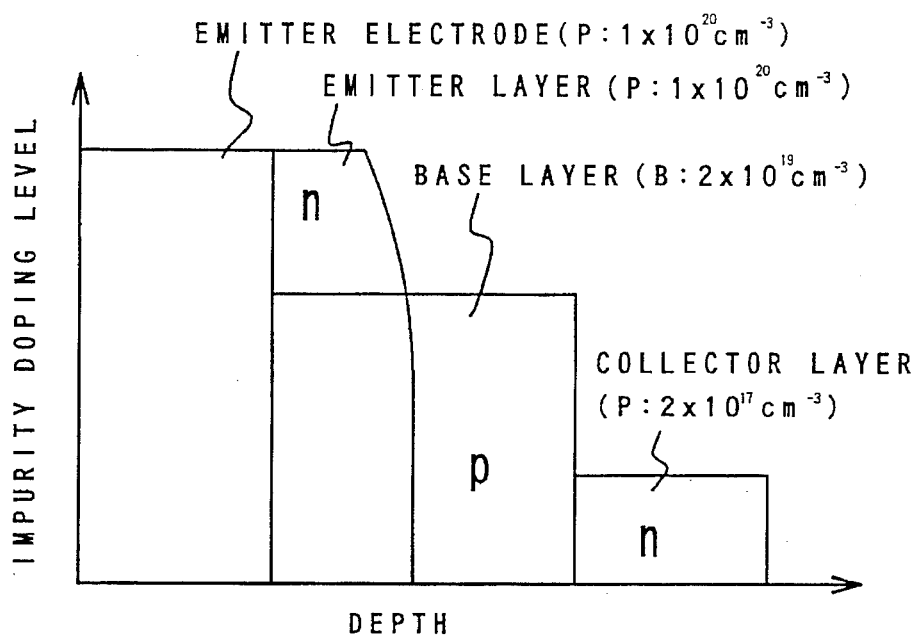
FIG. 1 shows an impurity distribution profile in a first conventional bipolar transistor.
Figure 2:
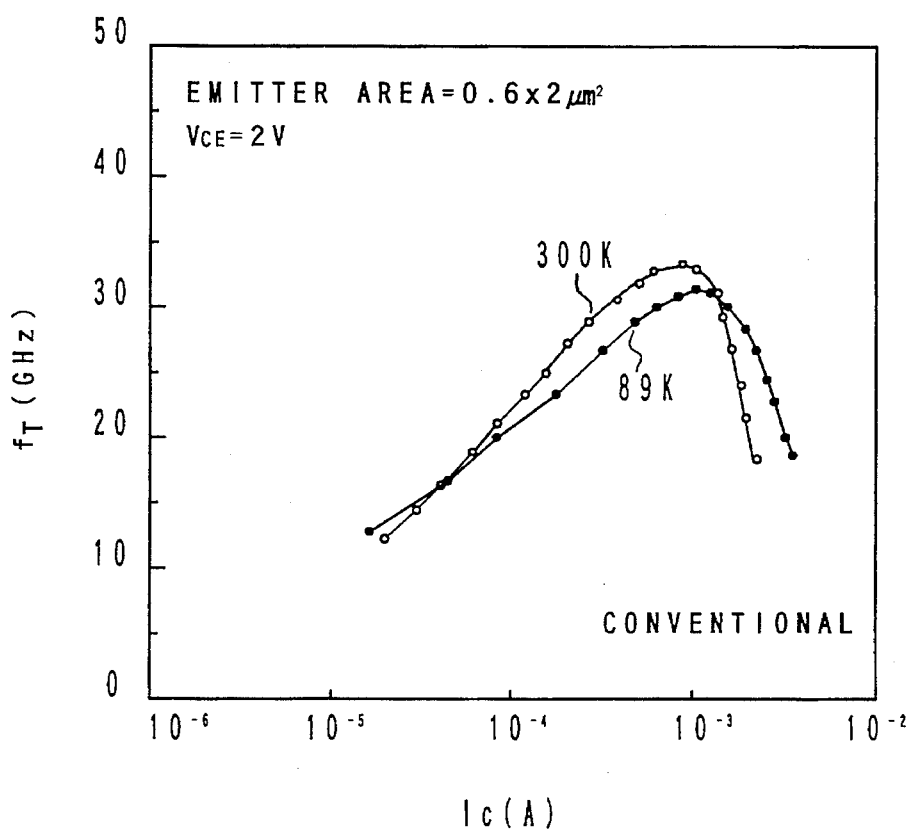
FIG. 2 is a graph showing a relation between the cut-off frequency $f_T$ and collector current $I_c$ in the bipolar transistor shown in FIG. 1.
Figure 3:
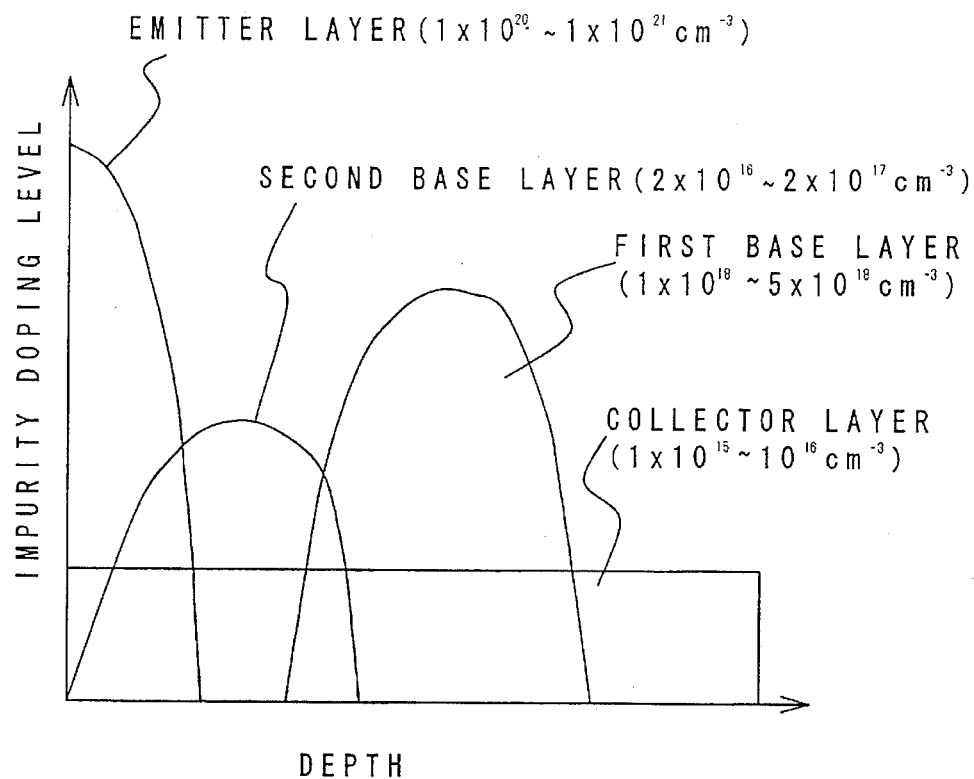
FIG. 3 shows an impurity distribution profile in a second conventional bipolar transistor.
Figure 18:
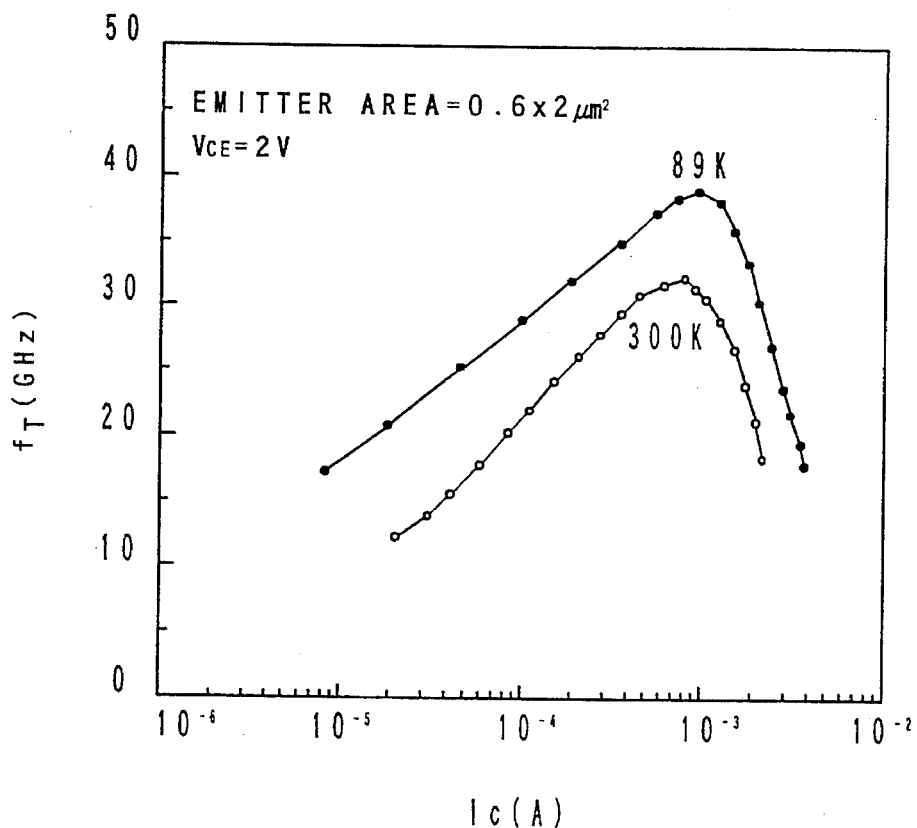
FIG. 18 is a graph showing a relation between the cut-off frequency $f_T$ and collector current $I_c$ in the bipolar transistor according to the second embodiment.

FIG. 18 shows the cut-off frequency–collector current ($f_T$–$I_c$) characteristics of a bipolar transistor having the impurity distribution profile according to the above embodiments at 300 and 89 K. The bipolar transistor has a high peak value of $f_T$ at 89 K. This would be because the emitter traveling time is shortened due to increasing of $h_{FE}$. As a result, there could be obtained the peak value of $f_T$ about 1.3 times as high as that of the conventional transistor shown in FIG. 2.

It is apparent that the present invention is not limited to the above embodiments but may be modified and changed without departing from the scope and spirit of the invention.

What is claimed is:

1. A method of manufacturing a bipolar transistor, comprising the steps of:

forming a collector region of a first impurity concentration;

selectively forming an oxide film pattern on said collector region;

forming an impurity-concentration-enhanced region in said collector region under said oxide film pattern;

forming a base electrode on said collector region and a part of said oxide film pattern;

removing said oxide film pattern;

forming a base region at a portion formed by removing said oxide film pattern on surfaces of said collector region and said impurity-concentration-region, such that said base region has an inversely graded impurity distribution profile in which a concentration of impurity is high at the surfaces of said collector region and said impurity-concentration-region and low at an opposite surface of said collector region and said impurity-concentration-region and such that said base region is coupled to said base electrode region; and forming an emitter region in said base region.

2. The method according to claim 1, wherein said step of forming an emitter includes the steps of:

forming a first emitter electrode layer on said base region with no impurity or with slightly doped impurity;

forming a second emitter electrode layer on said first emitter electrode layer with a concentration of impurity higher than that of said first emitter electrode layer; and performing heat treatment to diffuse the impurity of said second emitter electrode layer into said base region such that said emitter region is formed.

3. The method according to claim 1, wherein said step of forming a base region includes forming said base region while an impurity concentration is controlled such that said base region has the inversely graded impurity concentration profile.

4. The method according to claim 1, wherein said step of forming a base region comprises the steps of:

forming a first base region layer having a first impurity concentration on the surfaces of said collector region and said impurity-concentration-enhanced region;

forming a second base region layer having a impurity concentration lower than that of said first base region layer, on said first base region;

performing heat treatment for said first and second base region layers to form said base region.

5. The method according to claim 1, further comprising the step of forming a thin base layer between said collector region and impurity-concentration-enhanced region and said base region for preventing the impurity doped in said collector layer from being diffused into said base region.

6. The method according to claim 1, further comprising the step of forming a thin base layer between said collector region and enhanced region and said base region for preventing the impurity doped in said collector layer from being diffused into said base region.

7. A method of manufacturing a semiconductor device comprising the steps of:

forming a collector region having a first impurity concentration;

covering said collector region with an insulating film, impurities being selectively doped into said collector region through said insulating film to change a portion of said collector region to an impurity-concentration-enhanced portion thereby having a second impurity concentration higher than said first impurity concentration, a remaining portion of said collector region maintaining to have said first impurity concentration;

growing, after said impurity-concentration-enhanced portion is formed and said insulating film is removed, a base region on surfaces of said impurity-concentration-enhanced portion and a part of said remaining portion of said collector region such that said base region has an inversely graded impurity distribution profile in which an impurity concentration of a bottom surface portion thereof facing with said impurity-concentration-enhanced portion is higher than an impurity concentration of a top surface portion opposite to said bottom surface portion thereof; and selectively forming an emitter region ion in said top surface portion of said base region.

8. A method of manufacturing a semiconductor device comprising the steps of:

forming a collector region having a first impurity concentration;

selectively doping impurities having a conductivity type of said collector region into said collector region to change a portion of said collector region to an impurity-concentration-enhanced portion thereby having a second impurity concentration higher than said first impurity concentration, a remaining portion of said collector region maintaining to have said first impurity concentration;

growing, after said impurity-concentration-enhanced portion is formed, a base region on surfaces of said impurity-concentration-enhanced portion and a part of said remaining portion of said collector region such that said base region has an inversely graded impurity distribution profile in which an impurity concentration of a bottom surface portion thereof facing with said impurity-concentration-enhanced portion is higher than an impurity concentration of a top surface portion opposite to said bottom surface portion thereof;

forming a first emitter electrode layer on said base region with no impurity or with slightly doped impurity;

forming a second emitter electrode layer on said first emitter electrode layer with a concentration of impurity higher than that said first emitter electrode layer; and performing heat treatment to diffuse the impurity of said second emitter electrode layer into said base region such that an emitter region is formed.

9. A method of manufacturing a bipolar transistor, comprising the steps of:

forming a collector region of a first impurity concentration;

forming an impurity-concentration-enhanced region in said collector region, the impurity-concentration-enhanced region having a second impurity concentration higher than first impurity concentration;

laminating first and second layers on surfaces of said collector region and said impurity-concentration-region, said first layer having a concentration higher than that of said second layer;

performing heat treatment to form, from said first and second layers, a base region having an inversely graded impurity distribution profile such that a concentration peak is on the side of said collector region;

forming a first emitter electrode layer on said first base region with no impurity or with slightly doped impurity;

forming a second emitter electrode layer on said first emitter electrode layer with a concentration of impurity higher than that of said first emitter electrode layer; and performing heat treatment to diffuse the impurity of said second emitter electrode layer into said base region such that an emitter region is formed.

* * * * *